(12) United States Patent
Luo (10) Patent No.: US 11,692,886 B2
(45) Date of Patent: Jul. 4, 2023

(54) FORCE DETECTION CIRCUIT AND DEVICE, AND FORCE INPUT DEVICE

(71) Applicant: Shenzhen Huion Animation Technology Co., Ltd., Shenzhen (CN)

(72) Inventor: Yong Luo, Shenzhen (CN)

(73) Assignee: SHENZHEN HUION ANIMATION TECHNOLOGY CO., LTD., Shenzhen (CN)

( * ) Notice: Subject to any disclaimer, the term of this patent is extended or adjusted under 35 U.S.C. 154(b) by 108 days.

(21) Appl. No.: 17/498,854

(22) Filed: Oct. 12, 2021

(65) Prior Publication Data
US 2022/0163411 A1 May 26, 2022

(30) Foreign Application Priority Data
Nov. 23, 2020 (CN) .......................... 202011319383.0

(51) Int. Cl.
*G01L 1/14* (2006.01)
*G01L 1/22* (2006.01)
(Continued)

(52) U.S. Cl.
CPC ............ *G01L 1/142* (2013.01); *G01L 1/2262* (2013.01); *G06F 3/0202* (2013.01); *H03K 5/24* (2013.01); *H03K 21/02* (2013.01)

(58) Field of Classification Search
CPC ..... G01L 1/142; G01L 1/2262; G01L 1/2256; G01L 1/144; G01L 1/14; G01L 1/10; G06F 3/0202; H03K 5/24; H03K 21/02
See application file for complete search history.

(56) References Cited

U.S. PATENT DOCUMENTS

8,063,710 B2 * 11/2011 Shikata ............... H03L 1/00
331/111
8,159,234 B2 * 4/2012 Niwa ................ H03K 17/9502
324/207.16
(Continued)

*Primary Examiner* — Freddie Kirkland, III
(74) *Attorney, Agent, or Firm* — IPro, PLLC (57) ABSTRACT

The present invention provides a pressure detection circuit including an oscillator unit, configured to output an oscillation signal as a count clock signal of a counter unit; and the counter unit, connected to the oscillator unit and configured to acquire a frequency of the oscillation signal and count. The pressure detection circuit further includes a comparator unit, connected to the counter unit, and configured to detect a voltage variation obtained by a pressure conversion, and send a signal to control the counter unit to count or stop counting; a voltage converter unit, connected to one input terminal of the comparator unit, and configured to supply a fixed or variable comparable voltage to the comparator unit; a constant current source charging unit, connected to the other input terminal of the comparator unit, and configured to supply a linearly and gradually increased comparison voltage to the comparator unit; a charge/discharge control unit, connected to the constant current source charging unit, and configured to control the constant current source charging unit to charge or discharge, such that the comparable voltage output by the voltage converter unit is compared to cause an output terminal of the comparator unit to enable counting of the counter unit; wherein the oscillator unit or the voltage converter unit further includes a pressure acquiring unit, as a component of the voltage converter unit or the oscillator unit, configured to convert a pressure into a variation of the comparable voltage or the frequency of the oscillation signal. The invention also provides a pressure input device pressure detection device. The invention has the technical effects of high sensitivity and resolution, power saving, and wide applicability.

13 Claims, 7 Drawing Sheets

(51) Int. Cl.
  *G06F 3/02* (2006.01)
  *H03K 5/24* (2006.01)
  *H03K 21/02* (2006.01)

(56) References Cited

U.S. PATENT DOCUMENTS

2010/0033197 A1* 2/2010 Niwa .................... H03K 17/954
  324/686
2010/0225406 A1* 9/2010 Shikata .................... H03L 1/00
  331/1 R

* cited by examiner

FORCE DETECTION CIRCUIT AND DEVICE, AND FORCE INPUT DEVICE

FIELD OF THE PRESENT DISCLOSURE

The present disclosure, pertaining to the technical field of force detection, relates to a force detection circuit. Particularly, the present disclosure provides a force detection circuit, and additionally provides a force detection device including the force detection circuit, and a force input device including the force detection circuit or the force detection device.

DESCRIPTION OF RELATED ART

Common force-based input devices, such as a game joystick and a stylus, have been widely used in daily life, for example, used for playing games, drawing, and signing. Typically, a force variation amount is acquired by an analog-to-digital circuit (ADC). The ADC is generally an 8-bit to 12-bit ADC. If a higher resolution is desired, the number of bits needs to be increased (for example, 16 bits). For an ADC with even more significant bits, in the case of low voltages of a signal source, due to interference of noise, the resolution of the ADC fails to be fully utilized. For example, under a condition of 2 V/16 bits, one LSB=2 V/65536=31 2V/65536=31 µV. Background noise may be greater over this standard. Therefore, under such condition, the ADC with even more significant bits is not only easily subject to interference but also is costly, and additionally, the resolution of the ADC is low. For example, in a conventional fashion of digitally transferring force information, a control board supplies a specific frequency to calculate charging time of a capacitor and acquires force information of a capacitive sensor. However, since the charging time is the capacitor charging time (RC charging), a logarithmic relationship is present the force information and the force value on the sensor, and hence a corresponding relationship between the two fails to be actually reflected. In addition, by the conventional force acquisition way, a force acquiring element or device (for example, a sensor) is greatly restricted, and use thereof is extremely inconvenient.

BRIEF DESCRIPTION OF THE DRAWINGS

Many aspects of the exemplary embodiments can be better understood with reference to the following drawings. The components in the drawing are not necessarily drawn to scale, the emphasis instead being placed upon clearly illustrating the principles of the present disclosure.

DETAILED DESCRIPTION OF THE EXEMPLARY EMBODIMENTS

The present disclosure will hereinafter be described in detail with reference to several exemplary embodiments. To make the technical problems to be solved, technical solutions and beneficial effects of the present disclosure more apparent, the present disclosure is described in further detail together with the figure and the embodiments. It should be understood the specific embodiments described hereby is only to explain the disclosure, not intended to limit the disclosure.

Figure 1:
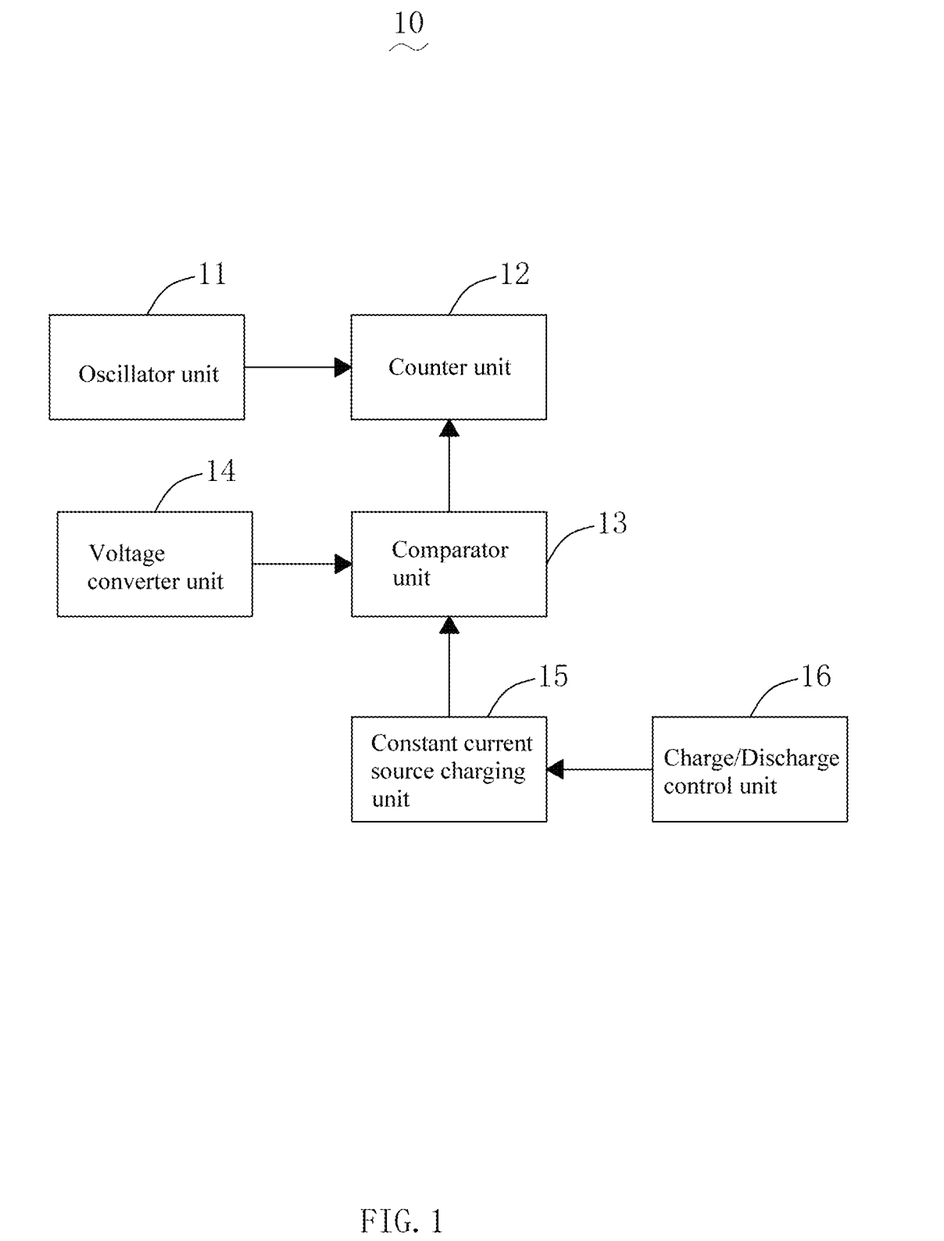
FIG. 1 is a structural block diagram of a force detection circuit according to an embodiment of the present disclosure.

FIG. 1 is a structural block diagram of the present disclosure. As illustrated in FIG. 1, a force detection circuit 10 is illustrated, which may also be represented as a force detection device, includes at least:

an oscillator unit 11, configured to output an oscillation signal as a count clock signal of a counter unit; and the counter unit 12, connected to the oscillator unit 11, and configured to acquire a frequency of the oscillation signal and count;

the force detection circuit further includes:

a comparator unit 13, connected to the counter unit 12, and configured to detect a voltage variation obtained by a force conversion, and send a signal to control the counter unit 12 to count or stop counting;

a voltage converter unit 14, connected to one input terminal of the comparator unit 13, and configured to supply a fixed or variable comparable voltage to the comparator unit 13;

a constant current source charging unit 15, connected to the other input terminal of the comparator unit 13, and configured to supply a linearly and gradually increased comparison voltage to the comparator unit 13;

a charge/discharge control unit 16, connected to the constant current source charging unit 15, and configured to control the constant current source charging unit 15 to charge or discharge, such that the comparable voltage output by the voltage converter unit 14 is compared to cause an output terminal of the comparator unit 13 to enable counting of the counter unit 12;

the oscillator unit 11 or the voltage converter unit 14 further includes a force acquiring unit, as a component of the voltage converter unit 14 or the oscillator unit 11, configured to convert a force into a variation of the comparable voltage or the frequency of the oscillation signal.

In the present disclosure, a force acquiring unit is used as a component of a voltage converter unit 14 or an oscillator unit 11, and a force is converted into a variation of a comparable voltage or a frequency of an oscillation signal, such that a force variation is acquired and sensed by the force acquiring unit of the oscillator unit 11 or the voltage converter unit 14, and based on a frequency variation of the oscillator unit 11 or a force variance of a voltage converter unit 14, a force magnitude and a force variation amount of the force acquiring unit are directly reflected by a proportional and continuous linear relationship between a counting result of the counter unit 12 and a force-receiving variation amount of the force acquiring unit. In this way, an acquired force value is more accurate with no need of a complicated analog-to-digital converter (ADC) circuit. In addition, power is saved, and resolution is high. Thus, this solution is applicable to most force acquiring units, and has strong practicability.

For precisely acquiring the force variance, the force detection circuit 10 in the present disclosure further includes a control signal unit 17, wherein the control signal unit 17 is connected to both a charge/discharge control unit 16 and the counter unit 12, and configured to reset a counter unit 12 and control the charge/discharge control unit 16 to control a charge/discharge voltage, such that a comparator unit 13 is controlled to charge or discharge by the charge/discharge control unit 16 so as to awake the counter unit 12 for counting.

The oscillator unit 11 is configured to generate and output the oscillation signal as a count clock signal of the counter unit 12. The oscillator unit at least includes a first inverter U1A, a second inverter U1B, a first capacitor C1, a first resistor R2, and a second resistor R1. The first inverter U1A and the second inverter U1B jointly constitute a two-stage signal amplifier, and may both employ an inverter of the same type, for example, a 7404 inverter. An output terminal of the first inverter U1A is connected to an input terminal of the second inverter U1B, an output terminal of the second inverter U1B is connected to the counter unit to output the oscillation signal, one terminal of the first resistor R2 is connected to an input terminal of the first inverter U1A, one terminal of the second resistor R1 is connected to the input terminal of the second inverter U1B, one terminal of the first capacitor C1 is connected to the output terminal of the second inverter U1B, and the other terminal of the first capacitor C1, the other terminal of the first resistor R2, and the other terminal of the second resistor R1 are all connected to each other.

Figure 2:
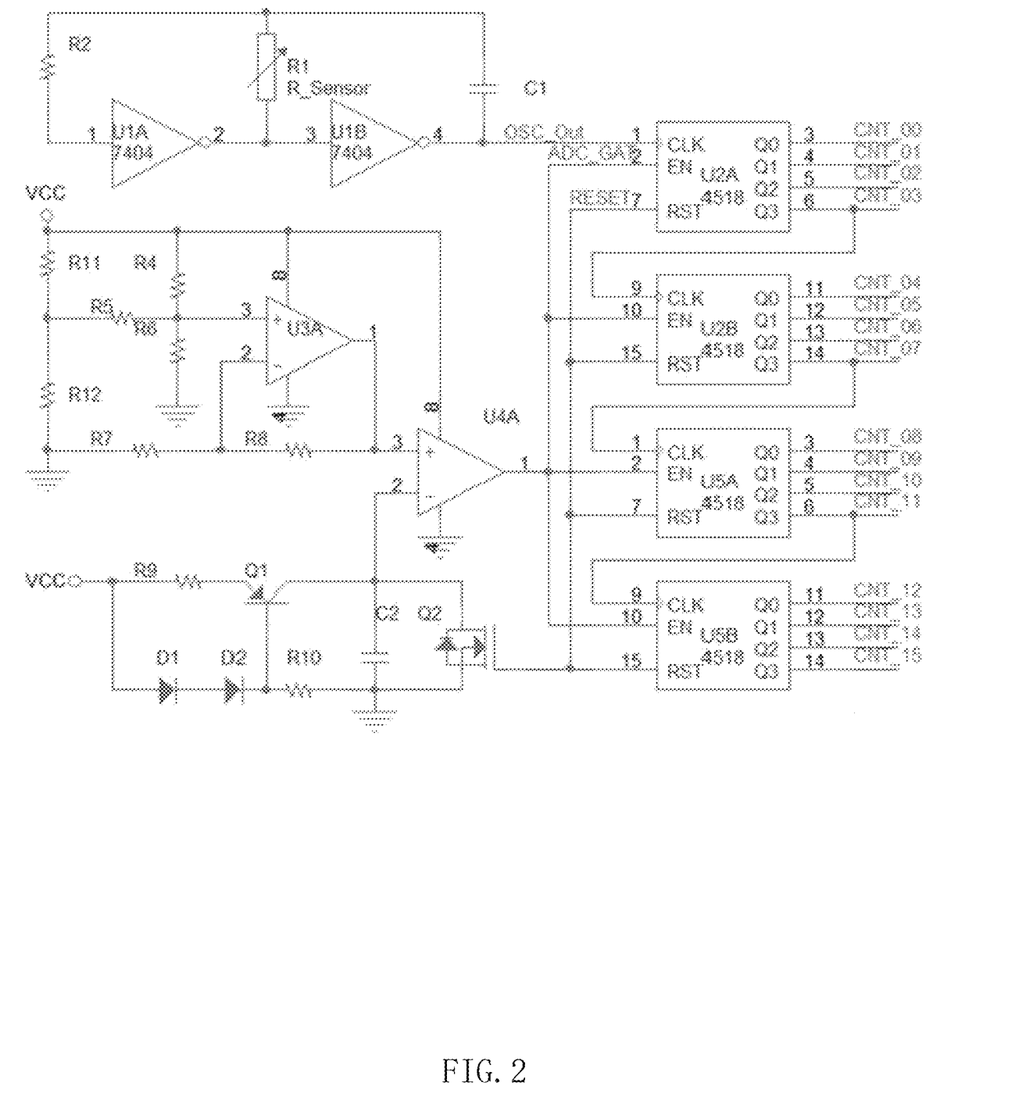
FIG. 2 is a schematic view of a force detection circuit in FIG. 1 with a resistive force sensor employed as a force acquiring unit.
Figure 3:
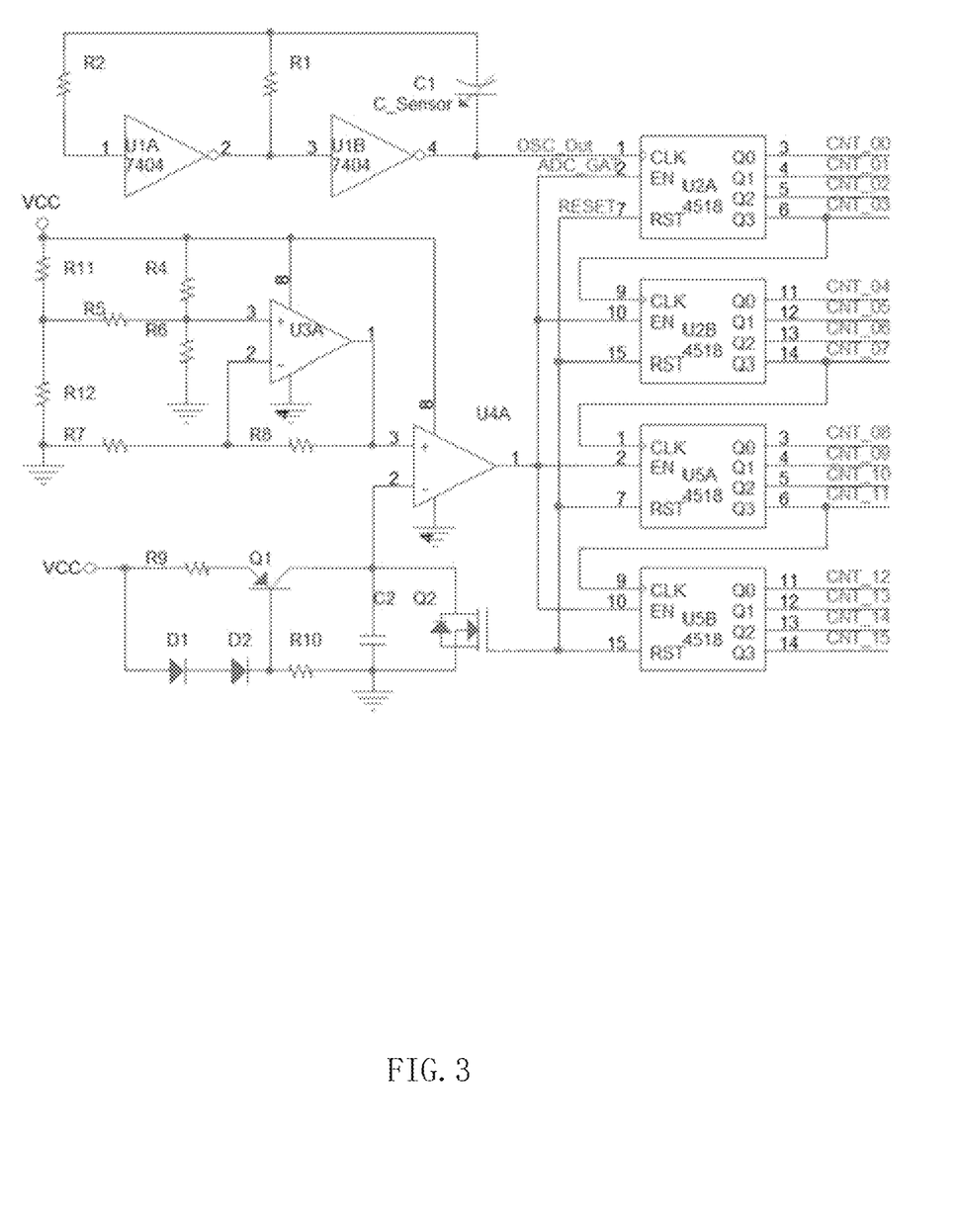
FIG. 3 is a schematic view of a force detection circuit in FIG. 1 with a capacitive force sensor employed as a force acquiring unit.
Figure 4:
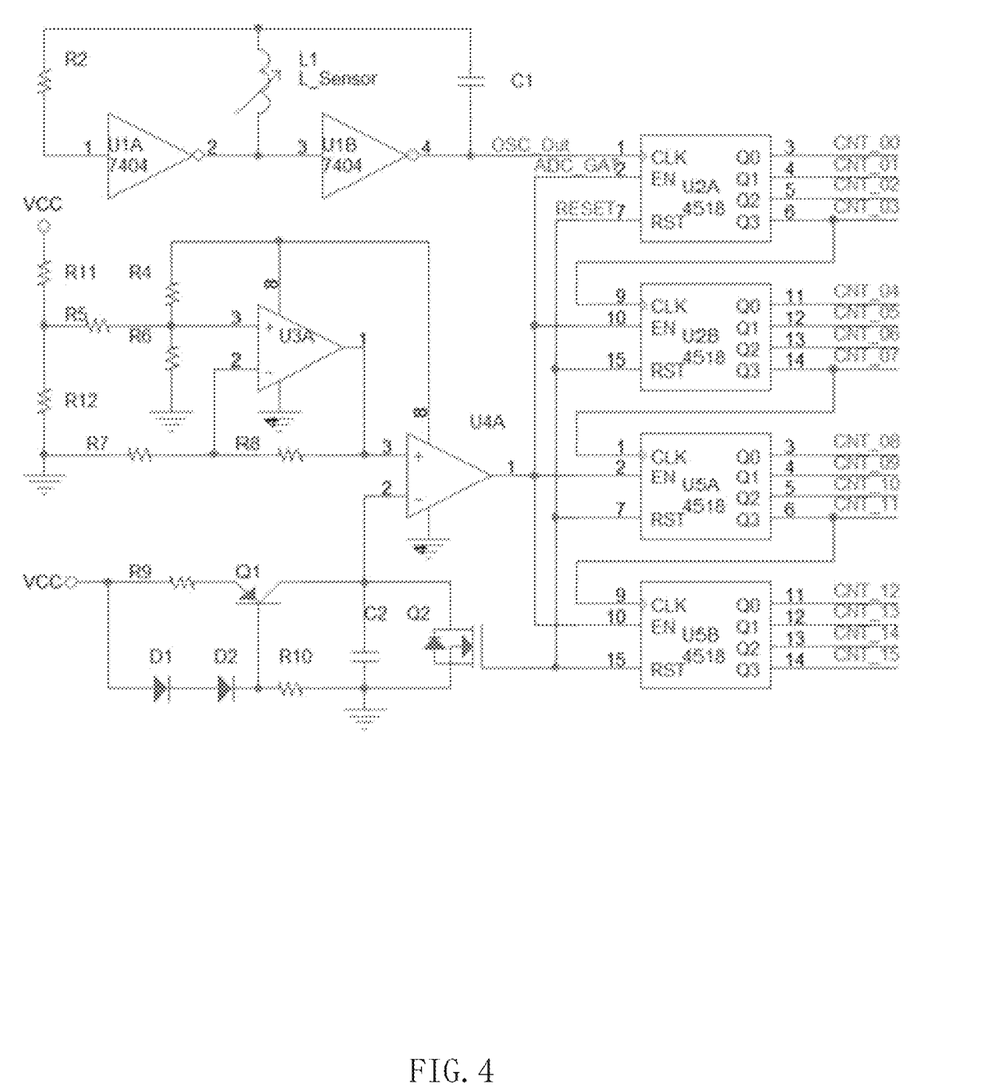
FIG. 4 is a schematic view of a force detection circuit in FIG. 1 with an inductive force sensor employed as a force acquiring unit.

The basic components of the oscillator unit 11 are described above. However, when the force acquiring unit is used as the component of the oscillator unit 11 and is configured to detect a force, the oscillation signal corresponding to the frequency may be generated by the oscillator unit 11 when a force is applied, a frequency of the oscillator unit 11 is changed when the force applied on the force acquiring unit changes. A frequency variation amount is proportional to the force of the force acquiring unit, and the voltage converter unit 14 supplies a fixed voltage at this moment. Specifically, in the basic components of the oscillator unit 11, the second resistor R1 may employ a resistive force sensor as the force acquiring unit of the oscillator unit 11, as illustrated in FIG. 2; or, the first capacitor C1 may employ a capacitive force sensor as the force acquiring unit of the oscillator unit 11, as illustrated in FIG. 3; or, the second resistor R1 is replaced by an inductive force sensor as the force acquiring unit of the oscillator unit 11, as illustrated in FIG. 4. Accordingly, the oscillator unit 11 may be applicable to multiple force acquiring units (the resistive force sensor, the capacitive force sensor, and the inductive force sensor), such that applicability of the present disclosure is high.

Still referring to FIG. 1 to FIG. 4, the comparator unit 13 is connected to the counter unit 12, and is configured to detect a voltage variation obtained by a force conversion and send a signal to control the counter unit 12 to count or stop counting. A comparator U4A may be directly used. A positive electrode of the comparator U4A is connected to the voltage converter unit 14 and a fixed or variable comparable voltage is acquired by the voltage converter unit 14. A negative electrode of the comparator U4A is connected to a constant current source charging unit 15 and a linearly and gradually increased compare voltage is acquired by the constant current source charging unit 15. An output terminal of the comparator U4A is connected to a enable control input terminal of the counter unit 12, by which the counter unit 12 inputs a gate signal of a pulse wave. However, the constant current source charging unit 15 is further connected to the charge/discharge control unit 16, and the voltage converter unit 14 is controlled to charge or discharge so as to change the comparison voltage, such that a potential at the output terminal of the comparator U4A is changed. When the output terminal of the comparator U4A has a high potential, the counter unit 12 starts counting, and when the output terminal of the comparator U4A has a low potential, the counter unit 12 stops counting.

Specifically, when the force acquiring unit is used as the component of the oscillator unit 11 and is configured to detect a force, the voltage converter unit 14 is a voltage amplifier. The voltage amplifier includes an operational amplifier U3A, a third resistor R5, a fourth resistor R11, a fifth resistor R12, a sixth resistor R7, a seventh resistor R8, an eighth resistor R4, and a ninth resistor R6. A negative electrode of the operational amplifier U3A is grounded, and a negative feedback connection is formed, such that voltages at positive and negative input terminals of the operational amplifier U3A are equal. A positive electrode of the operational amplifier U3A is successively connected to the third resistor R5 and the fourth resistor R11. The fourth resistor R11 is connected to an external first power source Vcc. The first power source Vcc may be further connected to a power source terminal of the operational amplifier U3A and supplies power to the operational amplifier U3A. An output terminal of the operational amplifier U3A is connected to the comparator U4A. The fifth resistor R12, the sixth resistor R7, the seventh resistor R8 are sequentially connected. The other terminal of the fifth resistor R12 is connected between the third resistor R5 and the fourth resistor R11. The sixth resistor R7 and the seventh resistor R8 are connected to the negative electrode of the operational amplifier U3A via a conducting wire. The other terminal of the seventh resistor R8 is connected to the output terminal of the operational amplifier U3A. One terminal of the eighth resistor R4 is connected to the positive electrode of the operational amplifier U3A, and the other terminal of the eighth resistor R4 is connected to the power source terminal of the operational amplifier U3A. One terminal of the ninth resistor R6 is connected to the positive electrode of the operational amplifier U3A, and the other terminal of the ninth resistor R6 is grounded. By maintaining or changing voltage magnitude of the external first power source Vcc, the positive electrode of the comparator U4A is maintained to input a fixed comparable voltage. In addition, when the force acquiring unit is in the oscillator unit 11, the voltage converter unit 14 supplies an enable signal having a fixed level, such that the counter unit 12 is enabled.

Figure 5:
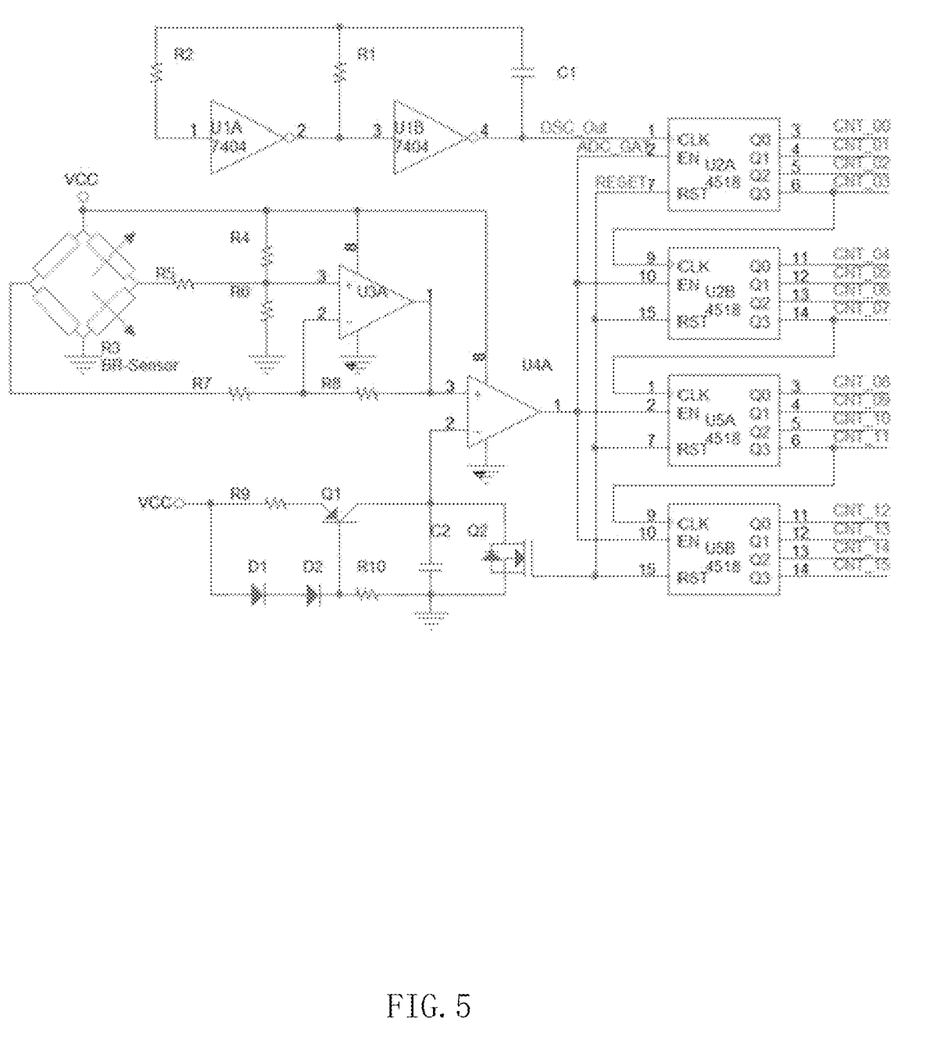
FIG. 5 is a schematic view of a force detection circuit in FIG. 1 with a bridge force sensor employed as a force acquiring unit.

The basic components of the voltage converter unit 14 are described above. However, when the force acquiring unit is used as the component of the voltage converter unit 14 and is subject to a force, the fourth resistor R11 and the fifth resistor R12 may be replaced by a bridge force sensor R3, which is used as the force acquiring unit of the voltage converter unit 14, as illustrated in FIG. 5. In this case, an output frequency of the oscillation signal is not changed but is constant (a fixed frequency), and the basic component of the oscillator unit 11 may be used as the entire oscillator unit. When the bridge force sensor R3 is subject to a force, the force on the bridge force sensor R3 is proportional to a voltage at a positive electrode of the comparator unit 13. In this case, the time when the charge/discharge control unit 16 is charged or discharged is proportional to the voltage at the positive electrode of the comparator unit 13, such that a counting result of the counter unit 12 is proportional to a force variation amount of the sensor.

It should be noted that the voltage converter unit 14 may be connected to the positive electrode of the comparator unit 13, for example, the comparator U4A in some embodiments. Specifically, the output terminal of the operational amplifier U3A is connected to the positive electrode of the comparator U4A, and the comparator U4A may be directly power supplied by the first power source Vcc.

Specifically, the constant current source charging unit 15 includes a transistor Q1, a first diode D1, a second diode D2, and a tenth resistor R9. The tenth resistor R9 is connected to an emitter of the transistor Q1 and an external second power source Vcc. An anode of the first diode D1 is connected to the external second power source Vcc, a cathode of the first diode D1 is connected to an anode of the second diode D2, a cathode of the second diode D2 is connected to a base of the transistor Q1, and a collector of the transistor Q1 is connected to the comparator unit 13. The constant current source charging unit 15 is configured to supply a linearly and gradually increased comparison voltage to the comparator unit 13, and the collector of the transistor Q1 may be connected to a negative electrode of the comparator unit 13, for example, the comparator U4A in some embodiments.

As a charge/discharge and control module in the present disclosure, the charge/discharge control unit 16 includes a second capacitor C2, a filed-effect transistor Q2, and an eleventh resistor R10. A negative electrode of the second capacitor C2 is connected to one terminal of the eleventh resistor R10, and is grounded, a positive electrode of the second capacitor C2 is connected to the collector of the transistor Q1, the other terminal of the eleventh resistor R10 is connected to the cathode of the second diode D2; a drain of the filed-effect transistor Q2 is connected to the collector of the transistor Q1 and an anode of the second capacitor C2, a source of the filed-effect transistor Q2 is connected to the negative electrode of the second capacitor C2, and is grounded, and a gate of the filed-effect transistor Q2 is connected to a control signal unit.

The counter unit 12 is configured to perform timing when the force acquiring unit is subject to a force, and is constituted by four counters. EN pins of the four counters are all connected to the comparator unit 13, RST pins of the four counters are all connected to the charge/discharge control unit 16, a CLK pin of one counter in the four counters is connected to the oscillator unit 11, and CLK pins of the remaining three counters are sequentially connected to a Q3 pin of the last counter. Specifically, the EN pins of the four counters may be connected to an output terminal of a specific comparator unit 13, for example, the comparator U4A in some embodiments, the CLK pin of one counter in the four counters may be connected to an oscillator unit 11, for example, connected to the output terminal of the second inverter U1B of the oscillator unit 11 as described above, and the RST pins of the four counters are connected to a charging/discharging control unit 16, for example, connected to the gate of the filed-effect transistor Q2 of the charge/discharge control unit 16 as described above. More specifically, the four counters are respectively a counter U2A, a counter U2B, a counter U5A and a counter U5B, and may employ a 4518-type counter or a pulse wave counter in any other type. The EN pins of the counter U2A, the counter U2B, the counter U5A and the counter U5B are all connected to the output terminal of the comparator U4A. The RST pins of the counter U2A, the counter U2B, the counter U5A and the counter U5B are all connected to the gate of the filed-effect transistor Q2.

The CLK pin of the counter U2A is connected to the output terminal of the second inverter U1B, and a Q3 pin of the counter U2A is connected to the CLK pin of the counter U2B. The Q3 pin of the counter U2B is connected to the CLK pin of the counter U5A, the Q3 pin of the counter U5A is connected to the CLK pin of the counter U5B, and the other pins of the counter U2A, the counter U2B, the counter U5A and the counter U5B, for example, Q0, Q1, Q2, Q3, and Q4, are taken as output pins and output counting results. It should be noted that the four counters used in this embodiment are only for ease of illustration, and an arity of the counter unit 12 is increased (multiplication of arity) each time one more counter is connected in series. Specifically, using a 4518-type counter as an example, a single counter is quaternary, a 4×4=16-nary counter is formed after the four counters are connected in series, a counting range of the counter unit 12 is 0 to 65535, and a final counting result of the value represents the force variation amount. Therefore, the comparator unit 13 in this embodiment is further configured to select, based on the force magnitude of the sensor, the counters in different arities and/or different quantities to constitute the counter unit 12. Specific composition of the comparator unit 13 is not limited in this embodiment.

To sum up, in combination with FIG. 1 to FIG. 4, when the force acquiring unit is a capacitive force sensor, a resistive force sensor, or an inductive force sensor, and when a force of the corresponding sensor varies, an oscillator circuit is formed in the oscillator unit 11 due to the impacts of the first capacitor C1, and frequency variation amount of the oscillator circuit is proportional to the force of the sensor. Since the positive electrode of the comparator U4A is connected to a fixed voltage, and the second capacitor C2 connected to a negative electrode of the comparator U4A is discharged first, the output terminal of the comparator U4A is at a high level, the counter unit 12 starts counting, and the constant current source charging unit 15 starts charging the second capacitor C2. Once a voltage of the second capacitor C2 becomes higher than the positive electrode of the comparator U4A, the output terminal of the comparator U4A is changed to be at a low level, the counter unit 12 stops counting, a counting result of the counter unit 12 is proportional to the force variation amount of the sensor. Therefore, the force variation of the sensor may be sensed, and charging time of the second capacitor C2 may be changed by changing capacitance magnitude of the second capacitor C2, thereby changing resolution of the entire detection circuit.

Further in combination with FIG. 5, when the force acquiring unit is a bridge force sensor R3, an output frequency of the oscillator circuit of the oscillator unit 11 is fixed (that is, a fixed first capacitor C1 and a fixed second resistor R1 are used). A force applied on the bridge force sensor R3 is proportional to a voltage at a positive electrode of the comparator U4A, the charging time that the constant current source charging unit 15 charges the second capacitor C2 is proportional to the voltage of the positive electrode of the comparator U4A, such that a proportional relationship between the counting result of the counter unit 12 and the force variation amount of the bridge force sensor R3 is acquired.

Figure 6:
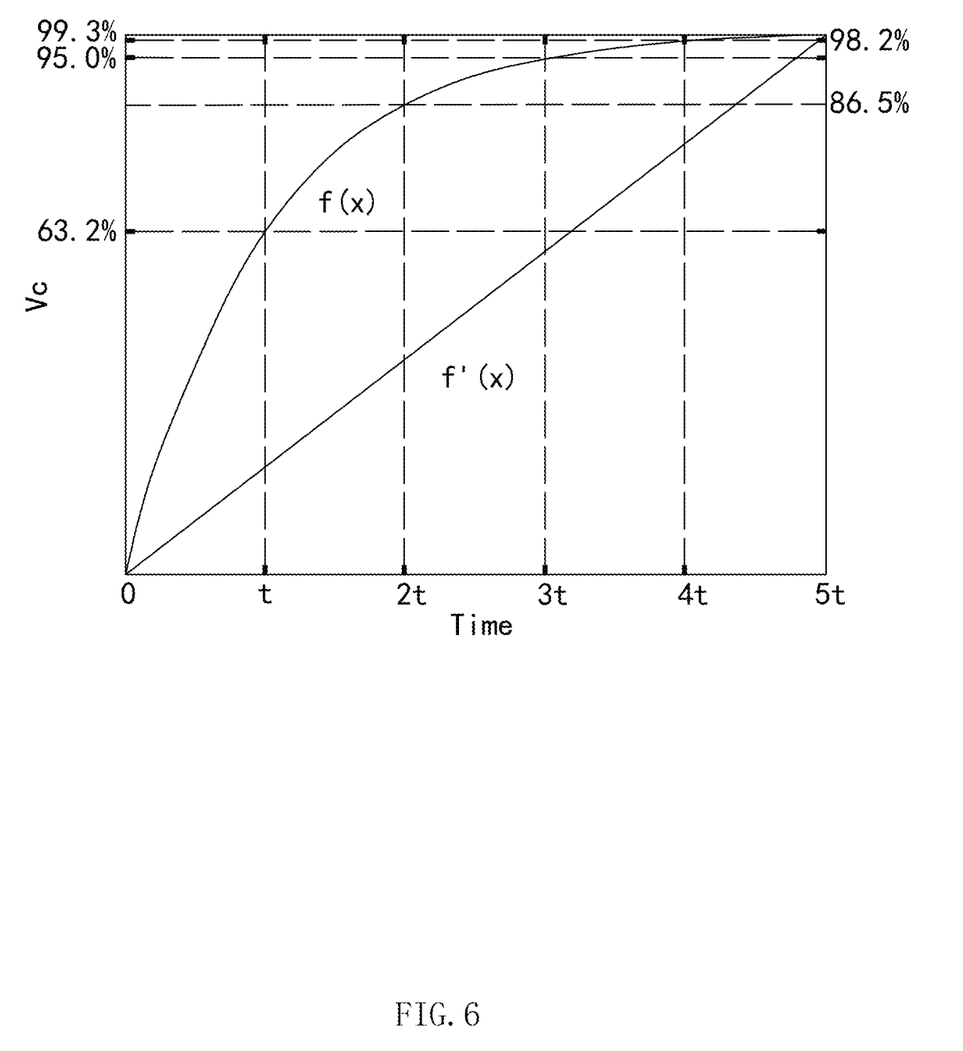
FIG. 6 is a charging curve comparison diagram of a second capacitor C2.

FIG. 6 is a charging curve comparison diagram of the second capacitor C2. It can be known in combination with FIG. 6 that:

1. Since resistor-capacitor circuit (RC) charging is used in the related art, and in the RC charging, a voltage is calculated by a formula $Vc=E-E*\exp(-t/RC)$, a logarithmic relationship is present between Vc and t, and the relationship is as illustrated in f(x).

2. In this embodiment, constant current charging is employed. The constant current charging observes a formula Vc=I*t/C. Since I is fixed, Vc and t are in a linear relationship, which is illustrated by f'(x). This directly reflects that the technical effect achieved by this embodiment that "the counting result of the counter is proportional to the variation amount of the force received by the sensor."

Figure 7:
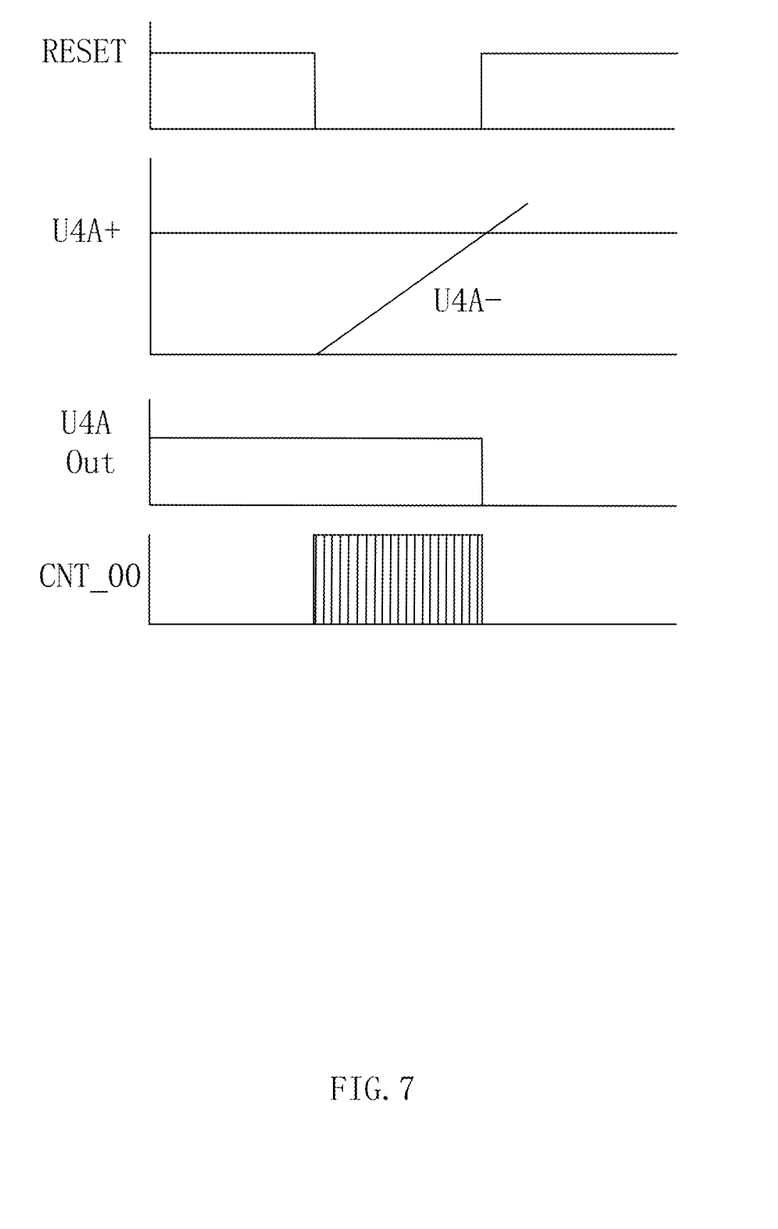
FIG. 7 is a waveform timing diagram of various signals in FIG. 2 to FIG. 5.

Based on the specific content of the force detection circuit 10 according to the above embodiments, FIG. 7 is a waveform timing diagram of various signals in FIG. 2 to FIG. 5 (CNT-00 in FIG. 7 indicates a counting clock signal output by the oscillator unit). With reference to FIG. 7, the specific operating principles of the force detection circuit 10 are as follows:

A. In the initial phase, RESET is at a high level, and the RST pins of the counter U2A, the counter U2B, the counter U5A, and the counter U5B and the gate of the field-effect transistor Q2 are all at a high level. In this case, the counter unit 12 is cleared and stops counting, the second capacitor C2 is discharged to zero level, and the output terminal (OUT) of the comparator U4A is at a high level.

B. Upon start of acquisition of a force, RESET is pulled down to a low level, and the RST pins of the counter U2A, the counter U2B, the counter U5A, and the counter U5B and the gate of the field-effect transistor Q2 are pulled down to a low level. In this case, the counter unit 12 starts counting, and the second capacitor C2 starts to be charged by the constant current source charging unit. When the voltage of the second capacitor C2 is higher than the voltage of the comparator U4A+ (the positive electrode of the comparator When the force acquiring unit is a capacitive sensor, the resistance is fixedly 10 KΩ, the timing is 1275 μs (T=2.2 RC), the force applied on the capacitive sensor is changed, the applied force progressively increases, the corresponding capacitance variations are C=5 pF, C=50 pF, and C=100 pF, and the corresponding force applying durations and oscillation frequencies are respectively 0.11 μs/9.09 MHz, 1.11 μs/909 KHz, and 2.2 μs/454 KHz. In this way, counting values obtained within 1275 μs are respectively 12622, 1262, and 631. As seen from the force variation amounts and the counting results, the counting result of the counter unit 12 is proportional to the variation amount of the force received by the sensor.

When the force acquiring unit is a resistive sensor, the capacitance is fixedly 5 pF, the timing is 1275 μs (T=2.2 RC), the force applied on the resistive sensor is changed, the applied force progressively increases, the corresponding resistance variations are R=500 KΩ, R=100 KΩ and R=10 KΩ and the corresponding force applying durations and oscillation frequencies are respectively 5.5 μs/181 KHz, 1.11 μs/909 KHz, and 0.11 μs/9.09 MHz. In this way, counting values obtained within 1275 μs are respectively 231, 1262, and 12622. As seen from the force variation amounts and the counting results, the counting result of the counter unit 12 is proportional to the variation amount of the force received by the sensor.

The specific data is as listed in Table 1:

TABLE 1

Counting data of capacitive and resistive sensors

Capacitive and resistive sensors (Counting by the counter: 1.25 V * 510 pF/0.5 μA = 1275 μs)

| | Timing of changing the capacitance when the resistance is fixedly 10 KΩ, 1275 μs (T = 2.2 RC) | | | Timing of changing the resistance when the capacitance is fixedly 5 pF, 1275 μs (T = 2.2 RC) | | |
|---|---|---|---|---|---|---|
| Force | Capacitance variation | Time/frequency | Value obtained within 1275 μs | Resistance variation | Time/frequency | Value obtained within 1275 μs |
| Small | C = 5 pF | 0.11 μs/9.09 MHz | 12622 | R = 500 KΩ | 5.5 μs/181 KHz | 231 |
| Medium | C = 50 pF | 1.11 μs/909 KHz | 1262 | R = 100 KΩ | 1.11 μs/9.09 KHz | 1262 |
| Large | C = 100 pF | 2.2 μs/454 KHz | 631 | R = 10 KΩ | 0.11 μs/9.09 MHz | 12622 |

U4A, wherein U4A− indicates the negative electrode of the comparator U4A), the output terminal (OUT) of the comparator U4A transitions to a low level, the EN pins of the counter U2A, the counter U2B, the counter U5A, and the counter U5B all transition to a low level, and the counter unit stops counting.

C. Upon completion of value reading, RESET is pulled up to a high level, and steps A and B are repeatedly performed.

Hereinafter, the present disclosure is further described with reference to the specific data.

(1) When the force acquiring unit is a capacitive sensor or a resistive sensor:

Counting time of the counter is:

$$Q=CV=IT$$

$$T=C*V/I$$

Specifically, V is a target voltage which takes a value of 1.25 V, the capacitance C takes a value of 510 pF, and the current takes a value of 0.5 μA. In this case, $$T=1.25\ V*510\ pF/0.5\ \mu A=1275\ \mu s;$$

(2) When the force acquiring unit is a resistive bridge sensor:

The counting timing of the counter is likewise T=(1.5 V*5/6)*510 pF/0.5 μA=1275 μs, the oscillator unit 11 uses a fixed frequency of 8 MHz, small, medium, and large forces are applied, the voltages output by the resistive bridge sensor corresponding to the applied forces are 0.2 V, 0.8 V, and 1.25 V, the corresponding electric quantity Q variations of the resistive bridge sensor are respectively 0.2*510 pC=102 pC, 0.8*510 pC=408 pC, and 1.25*510 pC=637.5 pC, and the corresponding force applying timings T are respectively 102 pC/0.5 μA=204 μs, 408 pC/0.5 μA=916 μs, and 637.5 pC/0.5 μA=1275 μs. In this case, at a fixed frequency of 8 MHz and within 1275 μs, the obtained counting values are respectively 1632, 7328, and 10200. It is apparent that the charging time of the second capacitor C2 by the constant current source charging unit 15 is proportional to the voltage at the positive electrode of the comparator U4A, and the counting result of the counter unit 12 is proportional to the variation amount of the force received by the bridge force sensor R3.

The specific data is as listed in Table 2:

TABLE 2

Counting data of resistive bridge sensor (including data in Table 1 for comparison)
Bridge force sensor (the oscillation signal has a fixed frequency of 8 MHz)

| Force | Q | | Q/I = T | Value obtained at 8 MHz |
|---|---|---|---|---|
| Small | 0.2 V | 0.2*510 pC = 102 pC | 102 pC/0.5 μA = 204 μs | 1632 |
| Medium | 0.8 V | 0.8*510 pC = 408 pC | 408 pC/0.5 μA = 916 μs | 7328 |
| Large | 1.25 V | 1.25*510 pC = 637.5 pC | 637.5 pC/0.5 μA = 1275 μs | 10200 |

Described above are all contents about the force detection device in the present disclosure. Based on these contents, the present disclosure further provides a force detection device. The force detection device at least includes the above mentioned force detection circuit.

The force detection device according to the present disclosure employs the above force detection circuit, and therefore has all technical functions of the force detection circuit. In this way, the force detection device has such product features as high sensitivity and resolution, power saving, and wide applicability, and can be widely used in various force detection devices and systems.

In the force detection device according to the present disclosure, some other structures, such as a housing configured to protect the force detection circuit, a carrier printed circuit board (PCB) for use as the force detection circuit, a carrier configured to input external force, such as a stylus, a game joystick, or the like, may employ an existing technical structure to implement corresponding functions as needed. The structure in the force detection device except for the force detection circuit is not limited in the present disclosure.

At last, the present disclosure further provides a force input device. The force input device at least includes the above force detection circuit, or at least includes the above force detection device.

The force input device according to the present disclosure employs the above force detection circuit or the force detection device, and therefore has all technical functions of the force detection circuit or the force detection device. In this way, the force input device has such product features as high sensitivity and resolution, power saving, and wide applicability, and can be widely used in various force input devices and systems.

In the force input device according to the present disclosure, some other structures, such as a housing configured to protect the force detection circuit, a carrier printed circuit board (PCB) for use as the force detection circuit, a carrier configured to input external force, such as a stylus, a game joystick, or the like, may employ an existing technical structure to implement corresponding functions as needed. The structure in the force input device except for the force detection circuit is not limited in the present disclosure.

It is to be understood, however, that even though numerous characteristics and advantages of the present exemplary embodiments have been set forth in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms where the appended claims are expressed.

What is claimed is:

1. A force detection circuit, comprising:
an oscillator unit, configured to output an oscillation signal as a count clock signal of a counter unit; and
the counter unit, connected to the oscillator unit, and configured to acquire a frequency of the oscillation signal and count;
wherein the force detection circuit further comprises:
a comparator unit, connected to the counter unit, and configured to detect a voltage variation obtained by a force conversion, and send a signal to control the counter unit to count or stop counting;
a voltage converter unit, connected to one input terminal of the comparator unit, and configured to supply a fixed or variable comparable voltage to the comparator unit;
a constant current source charging unit, connected to the other input terminal of the comparator unit, and configured to supply a linearly and gradually increased comparison voltage to the comparator unit;
a charge/discharge control unit, connected to the constant current source charging unit, and configured to control the constant current source charging unit to charge or discharge, such that the comparable voltage output by the voltage converter unit is compared to cause an output terminal of the comparator unit to enable counting of the counter unit;
wherein the oscillator unit or the voltage converter unit further comprises:
a force acquiring unit, as a component of the voltage converter unit or the oscillator unit, configured to convert a force into a variation of the comparable voltage or the frequency of the oscillation signal.

2. The force detection circuit according to claim 1, further comprising:
a control signal unit, connected to both the charge/discharge control unit and the counter unit, and configured to reset a counter and control the charge/discharge control unit to control a charge/discharge voltage.

3. The force detection circuit according to claim 1, wherein the oscillator unit comprises a first inverter U1A, a second inverter U1B, a first capacitor C1, a first resistor R2, and a second resistor R1;
wherein an output terminal of the first inverter U1A is connected to an input terminal of the second inverter U1B, an output terminal of the second inverter U1B is connected to the counter unit to output the oscillation signal, one terminal of the first resistor R2 is connected to an input terminal of the first inverter U1A, one terminal of the second resistor R1 is connected to the input terminal of the second inverter U1B, one terminal of the first capacitor C1 is connected to the output terminal of the second inverter U1B, and the other terminal of the first capacitor C1, the other terminal of the first resistor R2, and the other terminal of the second resistor R1 are all connected to each other;

wherein the first capacitor C1 uses a capacitive force sensor as a force acquiring unit of the oscillator unit;

or the second resistor R1 uses a resistive force sensor as the force acquiring unit of the oscillator unit;

or the second resistor R1 is replaced by an inductive force sensor as the force acquiring unit of the oscillator unit.

4. The force detection circuit according to claim 1, wherein the comparator unit is a comparator U4A.

5. The force detection circuit according to claim 4, wherein a positive electrode of the comparator U4A is connected to the voltage converter unit, a negative electrode of the comparator U4A is connected to the constant current source charging unit, and an output terminal of the comparator U4A is connected to a enable control input terminal of the counter unit.

6. The force detection circuit according to claim 1, wherein the voltage converter unit is a voltage amplifier.

7. The force detection circuit according to claim 6, wherein the voltage amplifier comprises an operational amplifier U3A, a third resistor R5, a bridge force sensor R3, a sixth resistor R7, a seventh resistor R8, an eighth resistor R4, and a ninth resistor R6;

wherein a positive electrode of the operational amplifier U3A is successively connected to the third resistor R5 and the bridge force sensor R3, the bridge force sensor R3 is connected to an external first power source Vcc, and an output terminal of the operational amplifier U3A is connected to a comparator U4A;

the bridge force sensor R3 is further connected to the sixth resistor R7, the sixth resistor R7 is connected to the seventh resistor R8, the sixth resistor R7 and the seventh resistor R8 are connected to a negative electrode of the operational amplifier U3A via a conducting wire, and the other terminal of the seventh resistor R8 is connected to the output terminal of the operational amplifier U3A;

one terminal of the eighth resistor R4 is connected to the positive electrode of the operational amplifier U3A, and the other terminal of the eighth resistor R4 is connected to the external first power source Vcc; and one terminal of the ninth resistor R6 is connected to the positive electrode of the operational amplifier U3A, and the other terminal of the ninth resistor R6 is grounded.

8. The force detection circuit according to claim 1, wherein the constant current source charging unit comprises a transistor Q1, a first diode D1, a second diode D2, and a tenth resistor R9;

wherein the tenth resistor R9 is connected to an emitter of the transistor Q1 and an external second power source Vcc; and an anode of the first diode D1 is connected to the external second power source Vcc, a cathode of the first diode D1 is connected to an anode of the second diode D2, a cathode of the second diode D2 is connected to a base of the transistor Q1, and a collector of the transistor Q1 is connected to the comparator unit.

9. The force detection circuit according to claim 8, wherein the charge/discharge control unit comprises a second capacitor C2, a filed-effect transistor Q2, and an eleventh resistor R10;

wherein a negative electrode of the second capacitor C2 is connected to one terminal of the eleventh resistor R10, and is grounded, a positive electrode of the second capacitor C2 is connected to the collector of the transistor Q1, the other terminal of the eleventh resistor R10 is connected to the cathode of the second diode D2; a drain of the filed-effect transistor Q2 is connected to the collector of the transistor Q1 and an anode of the second capacitor C2, a source of the filed-effect transistor Q2 is connected to the negative electrode of the second capacitor C2, and is grounded, and a gate of the filed-effect transistor Q2 is connected to a control signal unit.

10. The force detection circuit according to claim 3, wherein the counter unit is constituted by four counters;

wherein

EN pins of the four counters are all connected to the comparator unit, RST pins of the four counters are all connected to the charge/discharge control unit, a CLK pin of one counter in the four counters is connected to the oscillator unit, and CLK pins of remaining three counters are sequentially connected to a Q3 pin of the last counter.

11. The force detection circuit according to claim 10, wherein the four counters are respectively a counter U2A, a counter U2B, a counter U5A and a counter U5B;

Wherein the RST pins of the counter U2A, the counter U2B, the counter U5A and the counter U5B are all connected to the gate of the filed-effect transistor Q2, the CLK pin of the counter U2A is connected to the output terminal of the second inverter U1B, and a Q3 pin of the counter U2A is connected to the CLK pin of the counter U2B, a Q3 pin of the counter U2B is connected to the CLK pin of the counter U5A, a Q3 pin of the counter U5A is connected to the CLK pin of the counter U5B, and the other pins of the counter U2A, the counter U2B, the counter U5A and the counter U5B, are taken as output pins and output counting results.

12. A force detection device, comprising the force detection circuit as defined in claim 1.

13. A force input device, at least comprising the force detection circuit as defined in claim 1.

* * * * *